(12) United States Patent
Lee

(10) Patent No.: US 7,020,043 B1
(45) Date of Patent: Mar. 28, 2006

(54) SEMICONDUCTOR MEMORY DEVICE

(75) Inventor: Sang-Hee Lee, Kyoungki-do (KR)

(73) Assignee: Hynix Semiconductor, Inc., (KR)

( * ) Notice: Subject to any disclaimer, the term of this patent is extended or adjusted under 35 U.S.C. 154(b) by 0 days.

(21) Appl. No.: 11/180,933

(22) Filed: Jul. 12, 2005

(30) Foreign Application Priority Data

Dec. 28, 2004 (KR) ........................ 10-2004-0113623

(51) Int. Cl.
*G11C 7/00* (2006.01)
(52) U.S. Cl. ................................ 365/230.06; 365/222
(58) Field of Classification Search ............ 365/230.06, 365/222, 185.06, 205
See application file for complete search history.

(56) References Cited

U.S. PATENT DOCUMENTS 6,166,977 A * 12/2000 Saitoh et al. ............... 365/205
6,359,825 B1 * 3/2002 Aimoto et al. ......... 365/230.03

* cited by examiner

*Primary Examiner*—Vu A. Le
(74) *Attorney, Agent, or Firm*—Blakely Sokoloff Taylor & Zafman

(57) ABSTRACT

Provided is a semiconductor memory device that is capable of preventing unnecessary power consumption and providing high data reliability. The semiconductor memory device includes: a core voltage supplying part for supplying a core voltage; a memory cell array block; a bit line sense amplifier block for sensing and amplifying a voltage difference of bit line pairs of the memory cell array block; an overdriving signal generator for receiving an initial driving signal to generate an overdriving signal, while expanding an activation pulse width of the overdriving signal in an activation of a refresh signal; an overdriver for driving a connection node, which is coupled with the core voltage supplying part, to an external voltage higher than the core voltage in response to an inverted overdriving signal; a first power driver for driving a first power line of the bit line sense amplifier block to a voltage of the connection node in response to a first driving control signal; and a second power driver for driving a second power line of the bit line sense amplifier to a first power voltage in response to a second driving control signal.

8 Claims, 5 Drawing Sheets

SEMICONDUCTOR MEMORY DEVICE

FIELD OF THE INVENTION

The present invention relates to a semiconductor design technology; and, more particularly, to a semiconductor memory device for adjusting a driving force of an over-driver.

DESCRIPTION OF RELATED ART

As a low driving voltage is used for the purpose of low power consumption, a semiconductor memory device including a dynamic random access memory (DRAM) uses various circuits for helping an operation of a sense amplifier. One of them is an overdriving structure of a sense amplifier.

In general, data from a plurality of memory cells connected to a word line activated by a row address are transferred to a bit line and a bit line sense amplifier senses and amplifies a voltage difference of a bit line pair.

In the above operation, thousands of bit line sense amplifiers start to operate at the same time. Therefore, a driving time of the bit line sense amplifier is determined according to whether a sufficient amount of a current for driving it can be supplied.

However, due to the tendency of the low power consumption, it is difficult to supply a sufficient amount of the current at a time.

In order to solve this problem, an overdriving structure for the bit line sense amplifier has been adopted. That is, in an initial operation of the bit line sense amplifier (just after charge sharing between a cell and a bit line), a voltage higher than a normal voltage (a core voltage) is instantaneously applied to a power line (rto) of the bit line sense amplifier.

FIG. 1 is a circuit diagram of a semiconductor memory device having a conventional overdriving structure.

Referring to FIG. 1, the semiconductor memory device includes: a core voltage supplying unit for supplying a core voltage; a memory cell array block 10; a bit line sense amplifier block 20 for sensing and amplifying a voltage difference of a bit line pair BL and BLB of the memory cell array block 10; an overdriving signal generator 30 for generating an overdriving signal saovd in response to an initial driving signal bgn_ovd; an overdriver PM1 for driving a connection node N1 to an external voltage VDD higher than the core voltage VCORE in response to an inverted overdriving signal saovd; a first power driver NM1 for driving a power line rto of the bit line sense amplifier block 20 to a voltage of the connection node N1 in response to a driving control signal sap; and a second power driver MN2 for driving a power line sb of the bit line sense amplifier to a ground voltage VSS in response to a driving control signal san.

The bit line sense amplifier block 20 includes a bit line sense amplifier 22, upper and lower bit line separators 24a and 24b, a power line precharge unit 28, and a bit line precharge unit 26. The sense amplifier 22 senses and amplifies the voltage difference of the bit line pair BL and BLB, and the upper and lower bit line separators 24a and 24b connect the memory cell array block 10 and the bit line sense amplifier 22 in response to separation signals bish and bisl. The power line precharge unit 28 precharges the power lines rto and sb of the bit line sense amplifier 22 to a precharge voltage VBLP in response to an equalization signal bleq. The bit line precharge unit 26 precharges the bit line pair BL and BLB to the precharge voltage VBLP in response to the equalization signal bleq.

FIG. 2 is a circuit diagram of the overdriving signal generator shown in FIG. 1.

Referring to FIG. 2, the overdriving signal generator 30 includes a delay/inversion unit 32 for delaying and inverting the initial driving signal bgn_ovd, a NAND gate ND1 configured to receive the initial driving signal bgn_ovd and an output signal of the delay/inversion unit 32, and an inverter I1 for inverting an output signal of the NAND gate ND1 to output the overdriving signal saovd.

The delay/inversion unit 32 may be implemented with an odd number of inverters connected in series.

FIG. 3 illustrates level change of the signals when accessing the semiconductor memory device shown in FIG. 1.

Referring to FIG. 3, the equalization signal bleq is activated during a precharge period. Therefore, the power lines rto and sb of the bit line sense amplifier 22 are precharged to the precharge voltage VBLP by the power line precharge unit 28 and the bit line pair BL and BLB are precharged to the precharge voltage VBLP by the bit line precharge unit 26.

Then, the word line is activated so that a slight voltage corresponding to data of the memory cell is applied on the bit line pair BL and BLB.

Next, when the driving control signals sap and san are activated, the first and second power drivers NM1 and NM2 apply the voltage of the connection node N1 and the ground voltage VSS to the power lines rto and sb of the bit line sense amplifier, respectively. Therefore, the bit line sense amplifier is activated to sense and amplify the voltage difference of the bit line pair BL and BLB.

At this time, because the overdriving signal generator 30 activates the overdriving signal saovd in response to the initial driving signal bgn_ovd that is activated in the initial operation of the bit line sense amplifier 22, the overdriving unit PM1 drives the connection node N1 to the external voltage VDD higher than the core voltage VCORE. Accordingly, in the initial driving operation, the external voltage VDD is applied by the first power driver NM1 that drives the power line rto to the voltage of the connection node N1, thereby achieving the overdriving operation.

After the initial driving operation, the overdriving signal saovd is deactivated. Therefore, the core voltage VCORE is applied to the connection node N1, so that the core voltage VCORE is also applied to the power line rto by the first power driver NM1.

Then, the word line WL is deactivated by a precharge command and the equalization signal bleq is activated, so that the bit line pair BL and BLB and the power lines rto and sb of the bit line sense amplifier 22 are precharged to the precharge voltage VBLP.

Meanwhile, in order to drive the bit line sense amplifier much faster, the conventional semiconductor memory device uses the overdriver in the initial operation to connect the core voltage VCORE to the external voltage VDD for a short time, so that the bit line overdriving is performed. At this time, the activation period of the overdriving signal that determines the overdriving time is important.

For example, in the normal operation where only one bank is activated, the core voltage VCORE is not used often. In this case, if the activation width of the overdriving signal is long, the voltage level of the connection node rises above a desired level. Therefore, a logic circuit for discharging the voltage level of the connection node to the desired level is required, resulting in the unnecessary power consumption.

Also, when all four banks are activated just like the auto refresh operation, the core voltage VCORE is used often. In this case, if the activation width of the overdriving signal is short, the level of the core voltage VCORE is unstable even after the overdriving period. Therefore, when a new active command is applied consecutively, data fail may be caused.

Because the conventional semiconductor memory device generates the overdriving signal having the constant activation pulse width without regard to the operation of the semiconductor memory device, the power may be dissipated unnecessarily and data fail may be caused.

SUMMARY OF THE INVENTION

It is, therefore, an object of the present invention to provide a semiconductor memory device that is capable of preventing unnecessary power consumption and providing high data reliability.

In an aspect of the present invention, there is provided a semiconductor memory device, including: a core voltage supplying part for supplying a core voltage; a memory cell array block; a bit line sense amplifier block for sensing and amplifying a voltage difference of bit line pairs of the memory cell array block; an overdriving signal generator for receiving an initial driving signal to generate an overdriving signal, while expanding an activation pulse width of the overdriving signal in an activation of a refresh signal; an overdriver for driving a connection node, which is coupled with the core voltage supplying part, to an external voltage higher than the core voltage in response to an inverted overdriving signal; a first power driver for driving a first power line of the bit line sense amplifier block to a voltage of the connection node in response to a first driving control signal; and a second power driver for driving a second power line of the bit line sense amplifier to a first power voltage in response to a second driving control signal.

Preferably, the overdriving signal generator includes: a first pulse width adjusting part for expanding an activation pulse width of an initial driving signal in response to the refresh signal; and a second pulse width adjusting part for expanding an activation pulse width of an output signal of the first pulse width adjusting part or an activation pulse width of the initial driving signal in response to the output signal of the first pulse width adjusting part.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 1:
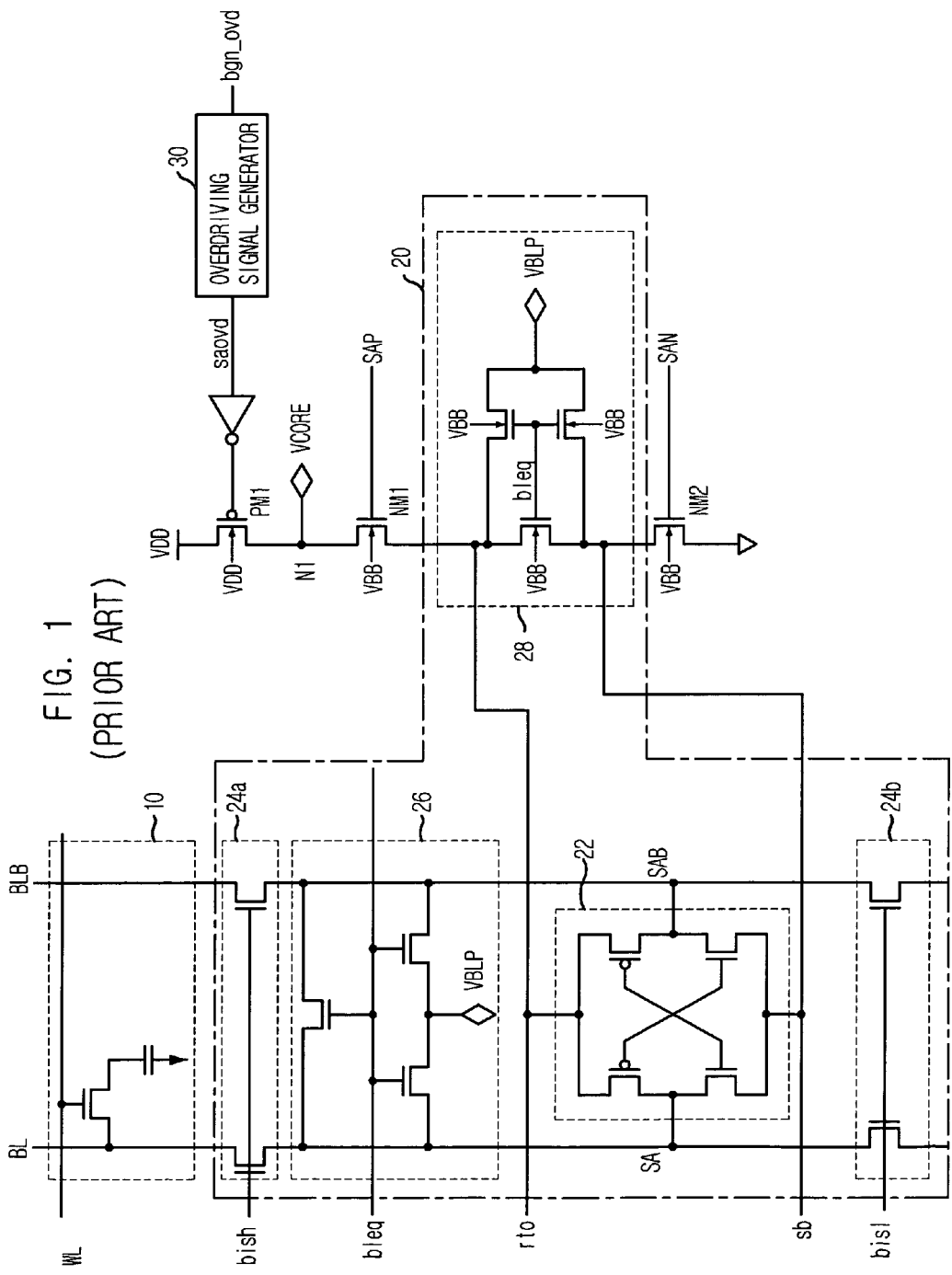
FIG. 1 is a circuit diagram of a conventional semiconductor memory device having an overdriving structure.
Figure 2:
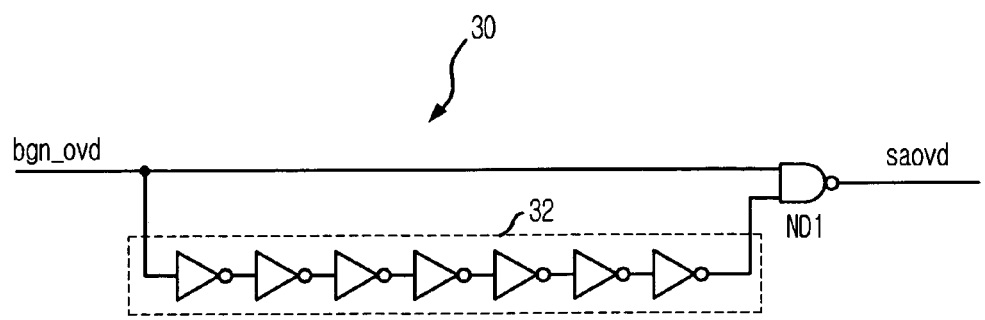
FIG. 2 is a circuit diagram of an overdriving signal generator shown in FIG. 1.
Figure 3:
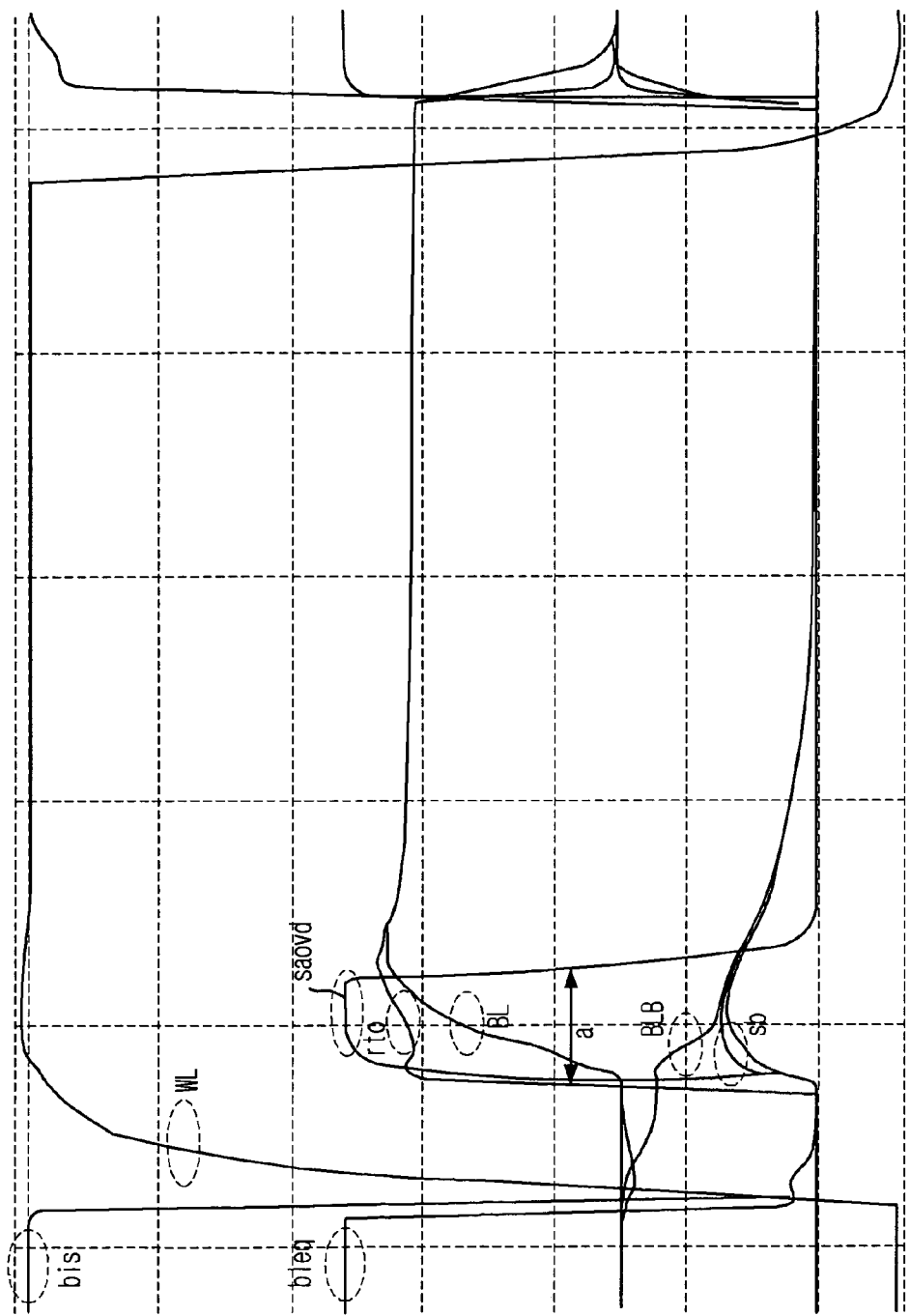
FIG. 3 illustrates level change of signals when accessing the semiconductor memory device shown in FIG. 1.
Figure 4:
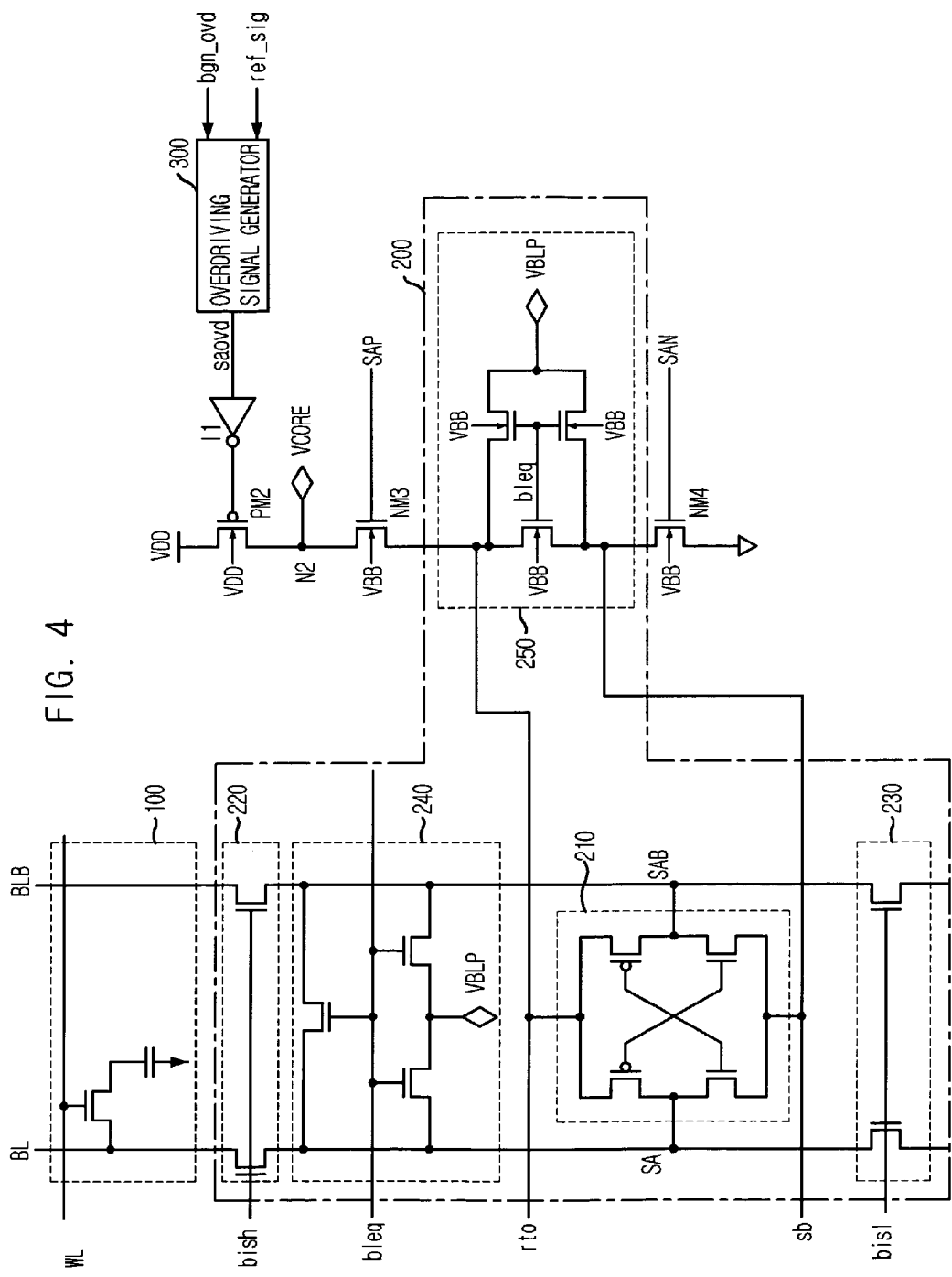
FIG. 4 is a circuit diagram of a semiconductor memory device having an overdriving structure in accordance with an embodiment of the present invention.

FIG. 4 is a circuit diagram of a semiconductor memory device having an overdriving structure in accordance with an embodiment of the present invention.

Referring to FIG. 4, the semiconductor memory device includes: a core voltage supplying part for supplying a core voltage; a memory cell array block 100; a bit line sense amplifier block 200 for sensing and amplifying a voltage difference of a bit line pair BL and BLB of the memory cell array block 100; an overdriving signal generator 300 for receiving an initial driving signal bgn_ovd to generate an overdriving signal saovd, while expanding an activation pulse width of the overdriving signal saovd in an activation of a refresh signal ref_sig; an overdriver PM2 for driving a connection node N2, which is coupled with the core voltage supplying part, to an external voltage VDD higher than the core voltage VCORE in response to an inverted overdriving signal saovd; a first power driver NM3 for driving a power line rto of the bit line sense amplifier block 200 to a voltage of the connection node N1 in response to a driving control signal sap; and a second power driver MN4 for driving a power line sb of the bit line sense amplifier to a ground voltage VSS in response to a driving control signal san.

The bit line sense amplifier block 200 includes a bit line sense amplifier 210, upper and lower bit line separators 220 and 230, a power line precharge unit 250, and a bit line precharge unit 240. The sense amplifier 210 senses and amplifies the voltage difference of the bit line pair BL and BLB, and the upper and lower bit line separators 220 and 230 connect the memory cell array block 100 and the bit line sense amplifier 210 in response to separation signals bish and bisl. The power line precharge unit 250 precharges the power lines rto and sb of the bit line sense amplifier 210 to a precharge voltage VBLP in response to an equalization signal bleq. The bit line precharge unit 240 precharges the bit line pair BL and BLB to the precharge voltage VBLP in response to the equalization signal bleq.

The inverted overdriving signal is outputted from an inverter I1 that receives the overdriving signal saovd.

Figure 5:
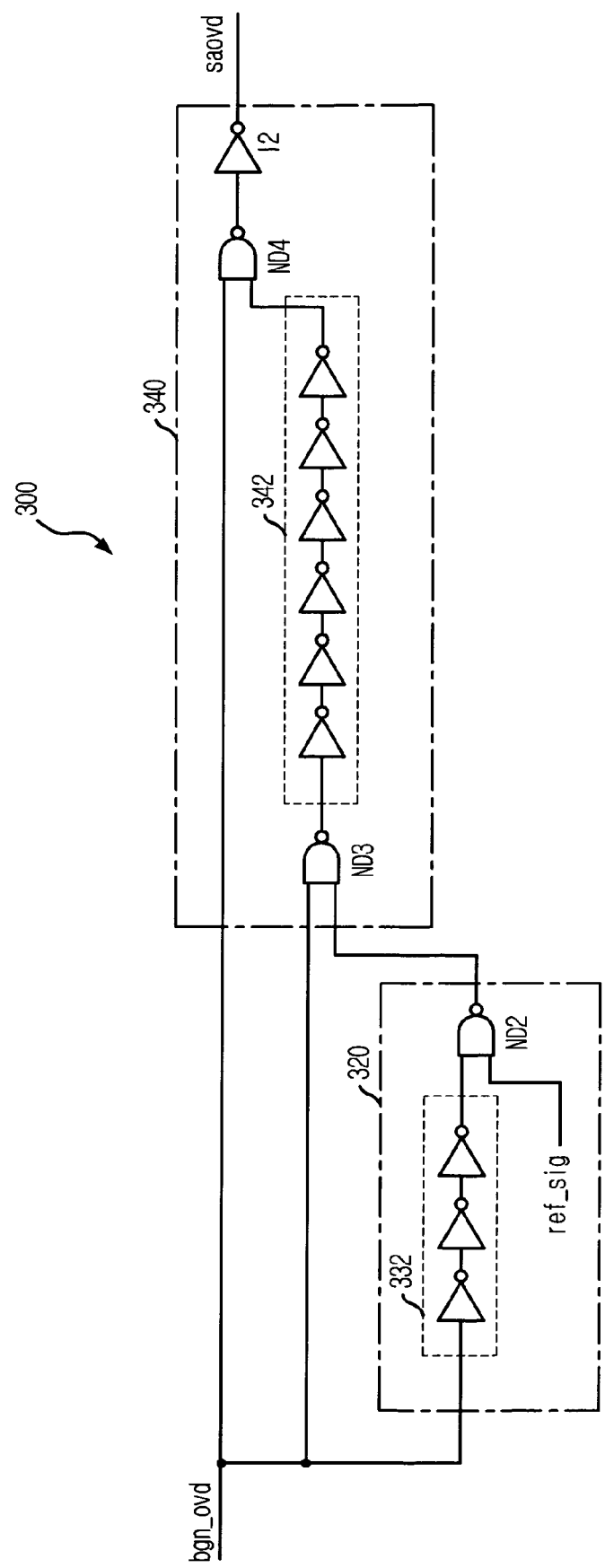
FIG. 5 is a circuit diagram of an overdriving signal generator shown in FIG. 4.

FIG. 5 is a circuit diagram of the overdriving signal generator shown in FIG. 4.

Referring to FIG. 5, the overdriving signal generator 300 includes a first pulse width adjusting part 320 for expanding an activation pulse width of an initial driving signal bgn_ovd in response to the refresh signal ref_sig, and a second pulse width adjusting part 340 for expanding an activation pulse width of an output signal of the first pulse width adjusting part 320 or an activation pulse width of the initial driving signal bgn_ovd in response to the output signal of the first pulse width adjusting part 320.

Also, the first pulse width adjusting part 320 includes a delay/inversion unit 322 for delaying and inverting the initial driving signal bgn_ovd, and a NAND gate ND2 receiving an output signal of the delay/inversion unit 322 and the initial driving signal bgn_ovd.

The second pulse width adjusting part 340 includes a NAND gate ND3 receiving the output signal of the first pulse width adjusting part 320 and the initial driving signal bgn_ovd, a delay unit 342 for delaying an output signal of the NAND gate ND3, a NAND gate ND4 receiving an output signal of the delay unit 342 and the initial driving signal bgn_ovd, and an inverter I2 for inverting an output signal of the NAND gate ND4 to output the overdriving signal saovd.

An operation of the overdriving signal generator 300 will be described later in brief.

First, in a normal operation, the refresh signal ref_sig is deactivated to a logic low level.

The first pulse width adjusting part 320 outputs a logic high (H) signal in response to the refresh signal ref_sig. In response to the output signal of the first pulse width adjusting part 320, the second pulse width adjusting part 340 expands the activation pulse width of the initial driving signal bgn_ovd by a delay of the delay unit 342 and then outputs the overdriving signal saovd.

Also, in an auto refresh operation, the refresh signal ref_sig is activated to a logic high level.

Therefore, the first pulse width adjusting part 320 expands the activation pulse width of the initial driving signal bgn_ovd by a delay that the delay/inversion unit 322 has.

Then, the second pulse width adjusting part 320 expands the activation pulse width of the signal outputted from the first pulse width adjusting part 320 by the delay of the delay unit 342 and then outputs the overdriving signal saovd.

Thus, in the normal operation, the overdriving signal generator 300 generates the overdriving signal saovd whose activation pulse width is expanded by the delay of the delay unit 340. Also, in the auto refresh operation, the overdriving signal generator 300 generates the overdriving signal saovd whose activation pulse width is expanded by the delays of the delay/inversion unit 322 and the delay unit 342.

Like this, the activation pulse width of the overdriving signal is different depending on the operation state of the device. When all banks of the device are activated, a larger number of the bit line sense amplifiers are activated, compared with the case where only one bank is activated like in the normal operation. Therefore, a larger amount of current is required compared with the auto refresh operation.

Meanwhile, the overdriving signal generator additionally receives the refresh signal so that the overdriving is performed for a longer time in the auto refresh operation than the normal operation.

Accordingly, in the case where the power consumption is small like in the normal operation, the overdriving period is shortened to thereby reduce the power consumption. In the case where the power consumption is large like in the auto refresh operation, the overdriving period is lengthened to thereby supply a large amount of current required in the auto refresh operation.

Thus, the overdriving period of the bit line sense amplifier is differently adjusted depending on the auto refresh operation and the normal operation. Consequently, unnecessary power consumption or power deficiency can be prevented and the device can operate stably.

Further, because of the efficient overdriving operation, the driving time of the bit line sense amplifier is shortened to thereby enhance tRCD and tWR that are AC parameters associated with the operating speed.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    a core voltage supplying part for supplying a core voltage;
    a memory cell array block;
    a bit line sense amplifier block for sensing and amplifying a voltage difference of bit line pairs of the memory cell array block;
    an overdriving signal generator for receiving an initial driving signal to generate an overdriving signal, while expanding an activation pulse width of the overdriving signal in an activation of a refresh signal;
    an overdriver for driving a connection node, which is coupled with the core voltage supplying part, to an external voltage higher than the core voltage in response to an inverted overdriving signal;
    a first power driver for driving a first power line of the bit line sense amplifier block to a voltage of the connection node in response to a first driving control signal; and
    a second power driver for driving a second power line of the bit line sense amplifier to a first power voltage in response to a second driving control signal.

2. The semiconductor memory device as recited in claim 1, wherein the overdriving signal generator includes:
    a first pulse width adjusting part for expanding an activation pulse width of an initial driving signal in response to the refresh signal; and
    a second pulse width adjusting part for expanding an activation pulse width of an output signal of the first pulse width adjusting part or an activation pulse width of the initial driving signal in response to the output signal of the first pulse width adjusting part.

3. The semiconductor memory device as recited in claim 2, wherein the first pulse width adjusting part includes:
    a delay/inversion unit for delaying and inverting the initial driving signal; and
    a first NAND gate receiving an output signal of the delay/inversion unit and the initial driving signal.

4. The semiconductor memory device as recited in claim 2, wherein the second pulse width adjusting part includes:
    a second NAND gate receiving the output signal of the first pulse width adjusting part and the initial driving signal;
    a delay unit for delaying an output signal of the second NAND gate;
    a third NAND gate receiving an output signal of the delay unit and the initial driving signal; and
    a first inverter for inverting an output signal of the third NAND gate to output the overdriving signal.

5. The semiconductor memory device as recited in claim 3, wherein the second pulse width adjusting part includes:
    a second NAND gate receiving the output signal of the first pulse width adjusting part and the initial driving signal;
    a delay unit for delaying an output signal of the second NAND gate;
    a third NAND gate receiving an output signal of the delay unit and the initial driving signal; and
    a first inverter for inverting an output signal of the third NAND gate to output the overdriving signal.

6. The semiconductor memory device as recited in claim 4, wherein the inverted overdriving signal is outputted from a second inverter that receives the overdriving signal.

7. The semiconductor memory device as recited in claim 5, wherein the inverted overdriving signal is outputted from a second inverter that receives the overdriving signal.

8. The semiconductor memory device as recited in claim 6, wherein the bit line sense amplifier block includes:
    a bit line sense amplifier for sensing and amplifying the voltage difference of the bit line pair;
    upper and lower bit line separators for connecting the memory cell array block and the bit line sense amplifier in response to a separation signal;
    a power line precharge unit for precharging first and second power lines of the bit line sense amplifier to a precharge voltage in response to an equalization signal; and
    a bit line precharge unit for precharging the bit line pair to the precharge voltage in response to the equalization signal.

* * * * *